United States Patent
Szelest et al.

(10) Patent No.: US 11,452,203 B2
(45) Date of Patent: Sep. 20, 2022

(54) WIRING ASSEMBLY BOARD

(71) Applicant: Aptiv Technologies Limited, St. Michael (BB)

(72) Inventors: Marcin Szelest, Dublin (IE); Pawel Skruch, Dublin (IE)

(73) Assignee: Aptiv Technologies Limited, St. Michael (BB)

( * ) Notice: Subject to any disclaimer, the term of this patent is extended or adjusted under 35 U.S.C. 154(b) by 0 days.

(21) Appl. No.: 17/171,958

(22) Filed: Feb. 9, 2021

(65) Prior Publication Data

US 2021/0274649 A1 Sep. 2, 2021

(30) Foreign Application Priority Data

Feb. 27, 2020 (EP) ..................................... 20159893

(51) Int. Cl.
*B23P 19/00* (2006.01)
*H05K 1/02* (2006.01)
(Continued)

(52) U.S. Cl.
CPC ....... *H05K 1/0268* (2013.01); *G01R 31/2808* (2013.01); *H01R 12/75* (2013.01); *H05K 3/32* (2013.01); *H05K 2203/162* (2013.01)

(58) Field of Classification Search
CPC ............. H01R 12/75; H05K 2203/162; H05K 1/0268; H05K 3/32; G01R 31/2808; G01R 31/58
See application file for complete search history.

(56) References Cited

U.S. PATENT DOCUMENTS 3,681,686 A  8/1972 Connally
3,891,811 A  6/1975 Miller
(Continued)

FOREIGN PATENT DOCUMENTS

CN  109470974  3/2019
DE  10019860  10/2001
(Continued)

OTHER PUBLICATIONS

"Extended European Search Report", EP Application No. 20159893.5, dated Aug. 17, 2020, 10 pages.
(Continued)

*Primary Examiner* — Paul D Kim
(74) *Attorney, Agent, or Firm* — Sawtooth Patent Group PLLC

(57) ABSTRACT

A wiring assembly board for assembling a wire harness. The wire harness comprises a plurality of wires connected between a plurality of wiring connectors, each connector comprising an array of wire terminals. The wiring assembly board comprises an assembly surface and a plurality of test connectors provided on the assembly surface. Each test connector is for connection to a respective wiring connector and comprises an array of test terminals for establishing an electrical connection with the respective array of wire terminals once the wiring and test connectors have been connected. A microcomputer is associated with each test connector and comprises an interface for individually transmitting or receiving test signals though each test terminal of the respective test connector.

20 Claims, 2 Drawing Sheets

(51) Int. Cl.
  *G01R 31/28* (2006.01)
  *H01R 12/75* (2011.01)
  *H05K 3/32* (2006.01)

(56) References Cited

U.S. PATENT DOCUMENTS

| | | | |
|---|---|---|---|
| 4,506,210 | A | 3/1985 | Chase |
| 4,937,519 | A | 6/1990 | Fields, III |
| 4,951,385 | A | 8/1990 | Desanto |
| 4,959,792 | A | 9/1990 | Sullivan |
| 5,260,659 | A | 11/1993 | Flowerdew et al. |
| 5,280,251 | A | 1/1994 | Strangio |
| 5,361,029 | A | 11/1994 | Rider et al. |
| 5,420,512 | A | 5/1995 | Spillane et al. |
| 5,483,169 | A | 1/1996 | Despain et al. |
| 5,557,651 | A | 9/1996 | Wissman |
| 5,570,010 | A | 10/1996 | Jin et al. |
| 6,282,265 | B1 | 8/2001 | Lowell et al. |
| 6,448,778 | B1 | 9/2002 | Rankin |
| 8,552,709 | B2 | 10/2013 | McCasland et al. |
| 9,813,810 | B1 | 11/2017 | Nongpiur |
| 10,996,286 | B2 | 5/2021 | Schmier et al. |
| 2002/0171434 | A1 | 11/2002 | Stanford et al. |
| 2004/0066202 | A1 | 4/2004 | Pereira et al. |
| 2005/0110500 | A1 | 5/2005 | Hoyte et al. |
| 2006/0043976 | A1 | 3/2006 | Gervais |
| 2007/0030014 | A1 | 2/2007 | Pandya et al. |
| 2009/0289616 | A1 | 11/2009 | Suozzo et al. |
| 2010/0281684 | A1 | 11/2010 | Selbach |
| 2011/0313708 | A1 | 12/2011 | Jin et al. |
| 2013/0018624 | A1 | 1/2013 | Bhatnagar et al. |
| 2013/0049731 | A1 | 2/2013 | Mathis et al. |
| 2014/0292349 | A1 | 10/2014 | Lussier |
| 2014/0327539 | A1 | 11/2014 | Cudak et al. |
| 2015/0073967 | A1 | 3/2015 | Katsuyama |
| 2016/0356836 | A1 | 12/2016 | Horan |
| 2018/0276321 | A1 | 9/2018 | Angelico et al. |
| 2019/0120889 | A1 | 4/2019 | Carcia |
| 2019/0310298 | A1 | 10/2019 | Bottman |
| 2021/0270912 | A1 | 9/2021 | Szelest et al. |
| 2021/0271323 | A1 | 9/2021 | Szelest et al. |

FOREIGN PATENT DOCUMENTS

| | | | |
|---|---|---|---|
| DE | 10308403 | | 9/2004 |
| DE | 102016213536 | | 1/2018 |
| EP | 2075883 | | 7/2009 |
| EP | 2910430 | | 8/2015 |
| EP | 3229496 | | 10/2017 |
| EP | 3460495 | | 3/2019 |
| EP | 3582511 | | 12/2019 |
| JP | 3640150 | B2 * | 4/2005 |
| JP | 2008226506 | | 9/2008 |
| JP | 4920191 | | 4/2012 |
| KR | 20100120176 | A * | 11/2010 |
| KR | 20120101873 | A | 9/2012 |
| WO | 0179871 | | 10/2001 |
| WO | 2015053936 | | 4/2015 |
| WO | 2016090342 | | 6/2016 |
| WO | 2017062124 | | 4/2017 |
| WO | 2019025113 | | 2/2019 |
| WO | 2019187349 | | 10/2019 |

OTHER PUBLICATIONS

"Extended European Search Report", EP Application No. 20159891.9, dated Aug. 19, 2020, 10 pages.

"Extended European Search Report", EP Application No. 20159896.8, dated Oct. 2, 2020, 10 pages.

Kirk, "Cognitive Software Defined Radar: A Reactive Approach to RFI Avoidance", 6 pages.

* cited by examiner

WIRING ASSEMBLY BOARD

CROSS-REFERENCE TO RELATED APPLICATION

This application claims priority to European Patent Application Number 20159893.5, filed Feb. 27, 2020, the disclosure of which is hereby incorporated by reference in its entirety herein.

INTRODUCTION

The present disclosure relates to a wiring assembly board and a method of verifying connections when assembling a wire harness. In particular, the present disclosure concerns a wiring assembly board with an integrated testing system for verifying connections as the wire harness is assembled, and a method of operating the same. The present disclosure is particularly suited to the assembly of wire harnesses for the automotive and aviation sectors.

BACKGROUND

Wire harnesses (also known as cable harnesses, and wiring assemblies or looms) are used to connect electrical components within automobiles and aeroplanes, as well as other vehicles, and construction machinery. By binding a large number of wires together in a bundle, wiring can thereby be installed into a vehicle more quickly and reliably. However, in spite of increasing automation, wire harnesses are still generally assembled by hand. As such, wire harnesses are often one of the most expensive parts within of a vehicle.

To assemble a wire harness, an assembly board is created which comprises a circuit diagram specific to the particular design variant of wire harness being assembled. The wires may also be prepared by cutting them to length, stripping their ends, and attaching connectors to some of the terminal ends. A technician will then match up individual wires or mini-bundles of wires to the circuit diagram on the assembly board surface, securing the wires in place using grips as they go. During this process, wires may be routed though sleeves, branches of wires may be separated and taped together, and wire terminals may be crimped together or attached into further connector housings. Finally, the main bundle of wires may be secured together, using cable ties or tape.

Once assembled, the wire harness will then be removed from the assembly board and sent for testing on a separate testing apparatus before installation. However, because of this, faulty electrical connections will often only be detected once the wire harness has been fully assembled, taped together, and removed from the assembly board. At this late stage, correcting the fault would require considerable manual labour to unbind the cable bundle, and then locate and repair the wiring.

The present disclosure therefore seeks to address the above issues.

SUMMARY

According to a first aspect, there is provided a wiring assembly board for assembling a wire harness comprising a plurality of wires connected between a plurality of wiring connectors, the wiring connectors comprising an array of wire terminals associated with the wires, the wiring assembly board comprising: a first surface onto which the plurality of wires and wiring connectors are arranged for assembling the wire harness; a plurality of test connectors provided on the first surface, each for connection to a respective wiring connector and comprising an array of test terminals for establishing an electrical connection with the respective array of wire terminals when the respective wiring and test connectors have been connected; and a plurality of microcomputers, each associated with a test connector and comprising an interface for individually transmitting or receiving test signals though the test terminals of the respective test connector.

In this way, a wiring assembly board is provided in which the microcomputers can operate independently to initiate the routing of test signals through specific wires, once they are connected. This allows swapped or incorrectly connected wires to be identified while the wire harness is still on the assembly board during the assembly process. As such, faults can be identified much earlier, which may thereby help to avoid to the need to rework faulty wire harnesses after their assembly. At the same time, the microcomputers are associated with individual test connectors, which allow the corresponding wiring connectors on the wire harness to be gripped during assembly. As such, the connectors may replace currently used mechanical grips by providing both a mechanical connection as well as an electrical coupling. This thereby simplifies the assembly process and minimises the need for additional grips that would otherwise be required.

In embodiments, the microcomputers comprise a wireless transceiver for communication with a controller through a wireless network. In this way, the microcomputers are able to operate in a coordinated manner based on instructions from a controller computer, without being physically connected. Not only does this avoid the need for wiring between the microcomputers, which would otherwise be expensive or impractical on larger assembly boards, but it also enables assembly boards to be easily reconfigured for different wire harness designs. Furthermore, the testing procedure may be generated automatically based on the plans of the electrical harness.

In embodiments, the assembly board further comprises a wireless router for routing communications between the plurality of microcomputers and the controller. In this way, the router may establish a small private network, such as a TCPIP network, for that assembly board. This may allow a technician to quickly identify which microcomputers, and hence associated test connectors, are present. Bar codes may be used to identify the hardware components, such that association with wireless network, as well as assignment of socket with virtual board architecture is done with bar/matrix code reader.

In embodiments, each of the plurality of microcomputers comprises an identifier tag readable by the router for identifying communication settings to establish wireless communications between the respective microcomputer and the router. This may further improve the speed of identifying which microcomputers, and hence associated test connectors, are present. For example, the identifier tag may be a Near Field Communication, NFC, tag, which a technician scans to establish communications between the microcomputer and the router. This allows different microcomputers, and hence different test connector types to be quickly swapped in and out, depending on the specific harness design requirements.

In embodiments, there is provided a second surface on an opposite side to the first surface, wherein the plurality of microcomputers are provided on the second surface. In this way, the microcomputers may be provided on the back or bottom of the assembly board, keeping the front or top face upon which the harness is assembled clear. This allows printed harness diagrams to be easily attached to the front or top face, without being obstructed by the testing components.

In embodiments, there is provided a plurality of apertures for accessing the plurality of test connectors. In this way, the test connectors may be coupled to the microcomputers on the back or bottom of the assembly board, but are exposed on the front or top of the assembly board through the apertures.

In embodiments, for each wiring connector and respective test connector, one of said connectors is a male connector and other of said connectors is a corresponding female connector.

In embodiments, the male connector comprises an array of pin terminals, and the female connector comprises an array of socket terminals.

In embodiments, each interface is a General Purpose Input Output, GPIO, Interface comprising a plurality of ports individually connected to test terminals within the respective test connector. In embodiments, the number of pins handled by the GPIO is equal or greater than number of pins of the connector (e.g. the GIPO may be capable of handling 100+ pins). In this way, the microcomputers may generate and detect signals through specific test terminals using a basic interface protocol. In embodiments, each socket may have a dedicated one-board computer, each having a GPIO. The socket and one-board computer may therefore operate as a pair which can be reused in other assembly boards, with each pair having a label with a unique bar-code for mapping the pair to the right place in the virtual network.

In embodiments, the plurality of microcomputers are configured to generate or detect test signals in response to received Representational State Transfer, REST, instructions. In this way, communication between the microcomputers and the controller is implemented with a REST interface, thereby providing simplified operation. That is, each microcomputer operates locally based on basic commands from the controller, without awareness of the other microcomputers. This avoids the need for expensive hardware on the assembly board. The sequence of REST instructions may be generated automatically basing on electrical diagram and mounting order.

In embodiments, the plurality of microcomputers are single circuit board computers. In this way, hardware costs can be minimised by utilising a simple microcomputer, such as Raspberry Pi, for each test connector. In embodiments, each single circuit board computer may have a GPIO and be capable of joining a nano-network thorough a wireless protocol, such as Wifi or Bluetooth.

In embodiments, there is provided a controller for controlling the plurality of microcomputers. In this way, a controller may be provided as a part of the wiring assembly board. For example, the wiring assembly board may be provided as a larger technician work station.

In embodiments, the controller controls the plurality of microcomputers based on specification information for the wire harness to be assembled.

According to a second aspect, there is provided a method for verifying connections when assembling a wire harness comprising the steps of: providing a wiring assembly board according to any of the above statements; connecting a first end of a wire to a first wiring terminal of a first wiring connector, and a second end of the wire to a second wiring terminal of a second wiring connector; instructing a first microcomputer associated with a first test connector connected to the first wiring connector to transmit a test signal through a first test terminal associated with the first wiring terminal; instructing a second microcomputer associated with a second test connector connected to the second wiring connector to detect the test signal at a second test terminal associated with the second wiring terminal; and generating a result signal for indicating whether the test signal was detected at the second test terminal.

In this way, individual wiring connections can be tested during the assembly of the wire harness, while the harness remains on the assembly board. This may thereby allow faults to be identified earlier.

In embodiments, the method further comprises the steps of connecting further wires to wiring connectors and instructing the microcomputers associated with the further wires to respectively transmit and detect test signals through each wire, and generating further result signals for indicating whether the result signals were detected. The assembly status may be stored in a Production Quality System for monitoring purposes.

BRIEF DESCRIPTION OF DRAWINGS

Illustrative embodiments will now be described with reference to the accompanying drawing in which.

DETAILED DESCRIPTION

Figure 1:
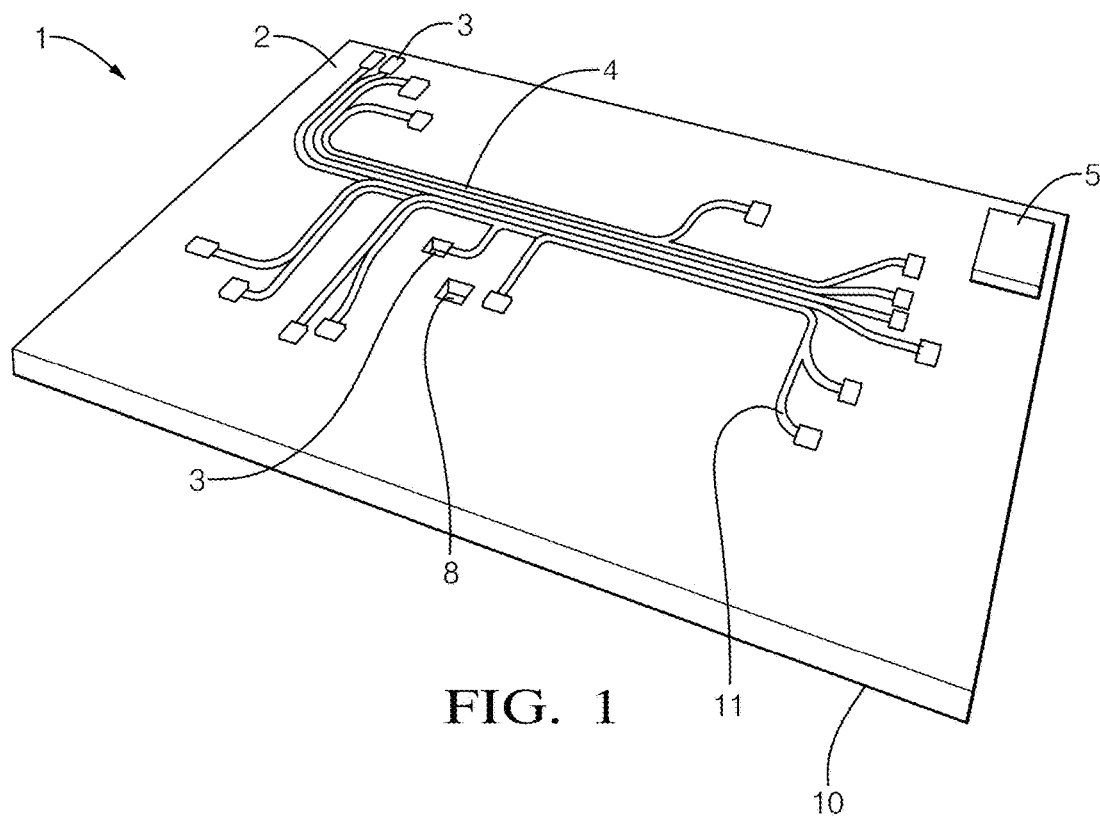
FIG. 1 shows a perspective view of a wiring assembly board according to an embodiment.

FIG. 1 shows a wiring assembly board 1 onto which a wire harness 4 is assembled. The wiring assembly board 1 comprises an assembly surface 2 having a plurality of exposed test connectors 8. The test connectors 8 correspond to wiring connectors 3 provided on the wire harness 4. That is, for a particular wiring connector 3 on the wire harness 4, the wiring assembly board 1 will have a corresponding test connector 8, with one being a male plug connector and the other the female socket. In FIG. 1, all but one of the wiring connectors 3 has been connected into their respective test connectors 8 (as shown in the bottom, central portion of the wire harness 4). Once connected, each wiring connector 3 is gripped by its corresponding test connector 8, thereby mechanically securing the respective section of wire harness 4 in place. It will be understood that other grips, clamps, and locator pins may be provided on the assembly surface 2 for securing the wires 11.

In this embodiment, the test connectors 8 extend through the assembly surface 2 to the back 10 of the assembly board, facing the floor.

The assembly board 1 is further provided with a wireless router 5. In this embodiment, the router is shown on the assembly surface 2, but in other embodiments the router 5 is provided on the back 10 or elsewhere on the assembly board 1 structure. The function of the router will be described in further detail below.

Figure 2:
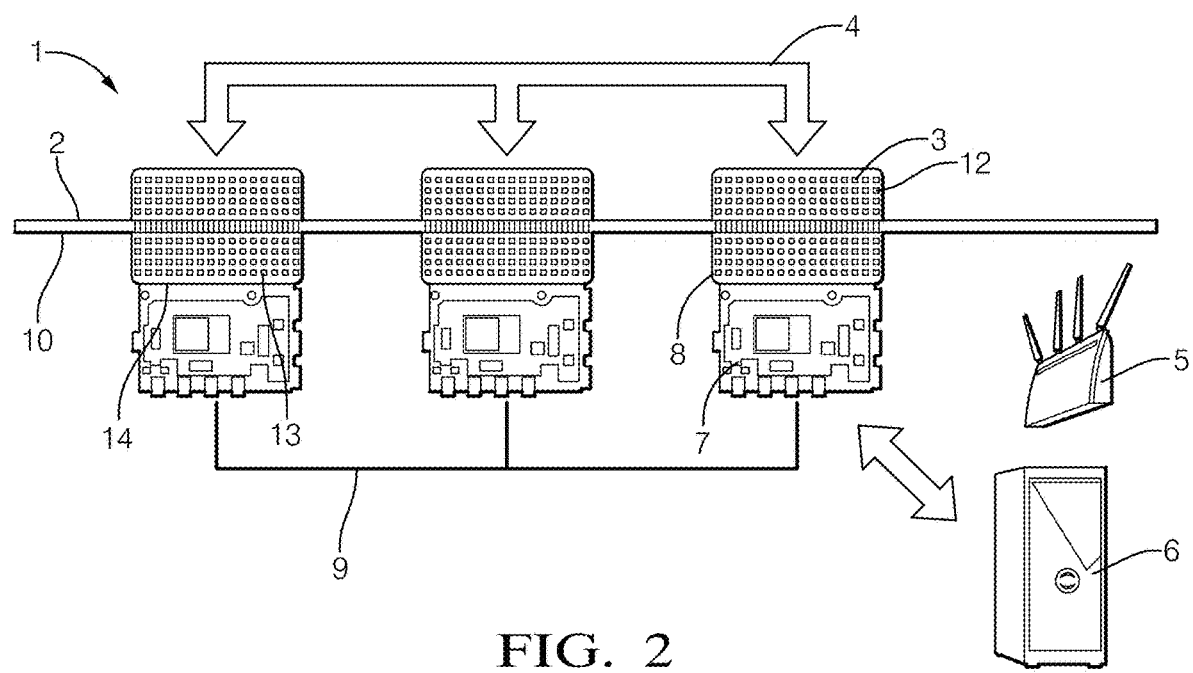
FIG. 2 shows a simplified schematic diagram of the wiring assembly board shown in FIG. 1.

FIG. 2 shows a simplified schematic diagram of the wiring assembly board shown in FIG. 1, as a vertical cross-section, with the assembly surface 2 on the top, and the back 10 of the assembly board on the bottom. In FIG. 2, for simplicity, only three wiring connectors 3 are shown connected into three test connectors 8.

Each wiring connector 3 and respective test connector 8 comprises a corresponding array of terminals 12, 13 which electrically couple with one another once the connectors 3,8 are connected together. For example, the wire terminals 12 on wiring connector 3 side may be provided as a plurality of pins which insert into female socket test terminals 13 provided on the test connector 8. Individual wire terminals 12 within the wiring connector 3 connect to one or more of the wires 11 of the wire harness 4.

Each test connector 8 is connected to a microcomputer 7 through an interface 14. In this embodiment, the microcomputer 7 is a basic single-board computer, such as a Raspberry Pi, and the interface 14 comprises a plurality of General Purpose Input Output (GPIO) ports that are separately wired to individual ones of the test terminals 13 within the test connector 8 array.

Figure 3:
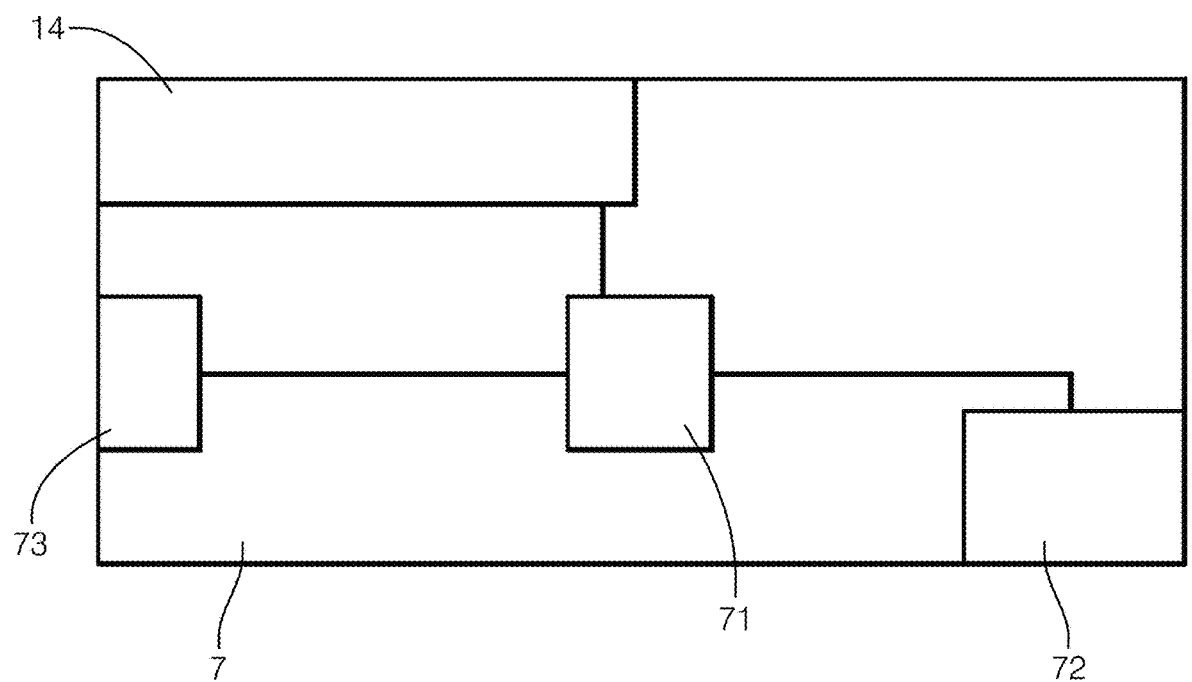
FIG. 3 shows a schematic diagram of an illustrative microcomputer for use in the embodiment shown in FIG. 1.

FIG. 3 shows a schematic diagram of the components of the microcomputer 7 in this embodiment. The microcomputer comprises a system on chip 71 connected to a memory 73 and WiFi transmitter 71. The system on chip 71 is further connected to the GPIO interface 14 for interfacing with the test connector 8.

The microcomputers 7 share a common ground 9 but are not operationally wired together. Instead, each microcomputer 7 uses the WiFi transmitter 72 to communicate with router 5 in a small, private Transmission Control Protocol/Internet Protocol (TCP/IP) network. The TCP/IP network is established between the router 5 and each microcomputer 7 the using Near Field Communication Labels. In this way, additional test connectors 8 and associated microcomputers 7 can be added to the assembly board 1, and microcomputers 7 can be used on different assembly boards or in modular assemblies.

A controller computer 6 is further provided for instructing the microcomputers 7 over the TCP/IP Wifi network. Communication between the computer 6 and the microcomputer 7 is implemented using Representational State Transfer (REST) interface. As such, the computer 6 transmits commands to the microcomputers 7, such as "set high signal on pin 8 of plug 2" or "please read value of digital signal on pin 43 of socket no. 5". In response, the particular microcomputer 7 associated with the designated connector (e.g. "plug 2", "socket no. 5") is then able to either generate a low power test signal, or detect an incoming test signal, on the designated test terminal 13 though the respective GPIO port.

In use, the computer 6 is provided with a wire harness specification or test instructions for the particular design variant of wire harness to be assembled. During the assembly process, the computer 6 will transmit REST instructions to selected microcomputers 7 via the router 5. Based on these instructions, the microcomputers 7 will then execute low power routing tests though the specific terminals to test the associated connected wires 11. That is, one microcomputer 7 will be instructed to generate a test signal at a particular test terminal 13 in its respective test connector 8, while another microcomputer 7 will be instructed to read for the test signal at the particular test terminal 13 in its respective test connector 8 which the wire harness specification indicates should be electrically connected by the wires 11. That is, if a wire 11 is connected correctly, the test signal will be routed from the test terminal 13, through the corresponding wire terminal 12 and connected wire 11. The microcomputers 7 may also be instructed to generate or detect a specific sequence of routing signals across its respective connector's terminal 13 array.

Each microcomputer 7 operates independently, under the instruction of the controller computer 6, to route test signals though specific test terminals 13 of the test connectors 8, and hence the corresponding wiring connectors 3. Importantly, this allows routing tests to be conducted periodically during the assembly process, while the wire harness 4 is still on the assembly board. That is, as wires 11 are secured into wiring connectors 3 and/or wiring connectors 3 are connected into their respective test connectors 8, test signals can be routed through the associated terminals 12, 13 to ensure the desired connection is established. It will also be understood that it is possible to execute a number of non-interfering tests at the same time.

In this connection, for example, a technician may be instructed by the software on the computer 6 to manually perform a designated number of assembly operations, for instance to connect the first ten wires or wire bundles. Once this is done, they may then instruct the computer 6 to perform a first test sequence by routing test signals though those first ten wires. Assuming no faults are detected, the technician may then perform the next ten assembly operations and run a second test sequence to test the newly added wires 11. In this way, swapped or incorrectly inserted wires can be detected during the assembly process. This allows faults to be identified much earlier, which will in turn significantly reduce the cost of reworking the wire harness to correct the fault.

Once assembled, the assembled wire harness 4 may then be detached from the assembly board 1 by unplugging the wiring connectors 3 from their respective test connectors 8, and removing the wire bundle from any grips or clamps.

Accordingly, with embodiments, wire harness faults may be detected and rectified during the assembly process, providing for early fault detection. Furthermore, by providing a distributed arrangement of microcomputers controllable through a wireless network, the assembly board 1 may be easily adapted to accommodate different wire harness designs and variants. For example, embodiments may be provided as modular arrangement where different test connectors 8 and/or microcomputers 7 may be swapped in and out, depending on the specific harness design being assembled. Equally, board sections may be added to allow larger wire harnesses to be accommodated. Importantly, the assembly board 1 does not need to be rewired in such situations; with a new wiring diagram provided on the assembly surface 2, once the appropriate test connectors 8 have been positioned, the controller computer 6 is able to run routing tests through the appropriate terminals 12 based on the technical specification of the wiring diagram. As such, embodiments described herein allow for flexibility to accommodate different harness designs.

It will be understood that the embodiment illustrated above shows an application only for the purposes of illustration. In practice embodiments may be applied to many different configurations, the detail of which being straightforward for those skilled in the art to implement.

What is claimed is:

1. A wiring assembly board for assembling a wire harness and verifying connections of the wire harness, the wiring assembly board comprising:
   a first surface configured for arranging a plurality of wires and a plurality of wiring connectors of the wire harness;
   a plurality of test connectors provided on the first surface, each respective test connector:
      configured for connection to a respective wiring connector of the wire harness; and
      comprising an array of test terminals configured to establish an electrical connection with an array of wire terminals on the respective wiring connector of the wire harness when the respective wiring connector of the wire harness is connected to the respective test connector; and a plurality of microcomputers, each respective microcomputer being associated with a respective test connector and comprising an interface for individually transmitting or receiving test signals through the test terminals of the respective test connector.

2. The wiring assembly board according to claim 1, wherein each respective microcomputer comprises a respective wireless transceiver for communication with a controller through a wireless network.

3. The wiring assembly board according to claim 2, wherein the wiring assembly board further comprises a wireless router for routing communications between the plurality of microcomputers and the controller.

4. The wiring assembly board according to claim 3, wherein each respective microcomputer comprises a respective identifier tag readable by the wireless router for identifying communication settings to establish wireless communications between the respective microcomputer and the wireless router.

5. The wiring assembly board according to claim 4, wherein the respective identifier tag comprises a near field communication (NFC) tag.

6. The wiring assembly board according to claim 2, wherein the wireless network comprises a WiFi or Bluetooth network.

7. The wiring assembly board according to claim 1, further comprising a second surface that is opposite the first surface, wherein the plurality of microcomputers are provided on the second surface.

8. The wiring assembly board according to claim 1, further comprising a plurality of apertures through the first surface for accessing the plurality of test connectors.

9. The wiring assembly board according to claim 1, wherein:
the respective test connector is a female connector and the respective wiring connector is a male connector; or
the respective test connector is a male connector and the respective wiring connector is a female connector.

10. The wiring assembly board according to claim 9, wherein:
the male connector comprises an array of pin terminals; and
the female connector comprises an array of socket terminals.

11. The wiring assembly board according to claim 1, wherein each interface is a General Purpose Input Output (GPIO) Interface comprising a plurality of ports individually connected to the test terminals within the respective test connector.

12. The wiring assembly board according to claim 1, wherein the plurality of microcomputers are configured to generate or detect test signals in response to received Representational State Transfer (REST) instructions.

13. The wiring assembly board according to claim 12, wherein the plurality of microcomputers are configured to receive the REST instructions via a TCP/IP protocol.

14. The wiring assembly board according to claim 1, wherein the plurality of microcomputers are single circuit board computers.

15. The wiring assembly board according to claim 1, further comprising a controller configured to control the plurality of microcomputers.

16. The wiring assembly board according to claim 15, wherein the controller is configured to control the plurality of microcomputers based on specification information for the wire harness.

17. The wiring assembly board according to claim 1, wherein the wiring connectors comprise automotive or aviation connectors.

18. The wiring assembly board according to claim 1, further comprising a circuit diagram.

19. The wiring assembly board according to claim 18, wherein the circuit diagram corresponds to the wire harness.

20. The wiring assembly board according to claim 1, wherein each respective test connector is configured to provide a mechanical and electrical connection to the respective wiring connector.

* * * * *